US009831541B2

(12) United States Patent
Yeo et al.

(10) Patent No.: US 9,831,541 B2
(45) Date of Patent: Nov. 28, 2017

(54) WAVEGUIDE AND METHOD FOR MAKING A WAVEGUIDE

(75) Inventors: Ching Biing Yeo, Singapore (SG); Yu Gang Ma, Singapore (SG); Hisashi Masuda, Singapore (SG); Hirofumi Kawamura, Singapore (SG)

(73) Assignee: Sony Corporation, Tokyo (JP)

(*) Notice: Subject to any disclaimer, the term of this patent is extended or adjusted under 35 U.S.C. 154(b) by 298 days.

(21) Appl. No.: 13/546,443

(22) Filed: Jul. 11, 2012

(65) Prior Publication Data

US 2013/0021764 A1 Jan. 24, 2013

(30) Foreign Application Priority Data

Jul. 20, 2011 (SG) ............................... 201105327-9

(51) Int. Cl.
*H05K 7/00* (2006.01)
*H01P 11/00* (2006.01)

(52) U.S. Cl.
CPC ....... *H01P 11/002* (2013.01); *Y10T 29/49016* (2015.01)

(58) Field of Classification Search
USPC .................................. 361/760, 761; 174/260
See application file for complete search history.

(56) References Cited

U.S. PATENT DOCUMENTS

| | | | |
|---|---|---|---|
| 5,771,567 A | 6/1998 | Pierce et al. | |
| 6,544,651 B2 | 4/2003 | Wong et al. | |
| 7,741,396 B2 | 6/2010 | Tan et al. | |
| 2002/0016396 A1* | 2/2002 | Wong et al. | 524/394 |
| 2003/0119656 A1 | 6/2003 | Chiu et al. | |
| 2005/0176575 A1 | 8/2005 | Chiu et al. | |
| 2006/0008700 A1* | 1/2006 | Yong | H01M 2/1653 429/144 |
| 2007/0117898 A1 | 5/2007 | Tan et al. | |
| 2007/0297713 A1* | 12/2007 | Lu et al. | 385/14 |
| 2008/0289866 A1* | 11/2008 | Yuri | H01L 23/49822 174/260 |
| 2011/0181376 A1* | 7/2011 | Vanhille | H01P 3/06 333/243 |
| 2011/0187602 A1* | 8/2011 | Nair | C03C 3/068 343/700 MS |

FOREIGN PATENT DOCUMENTS

| | | |
|---|---|---|
| EP | 0 826 649 A1 | 3/1998 |
| EP | 0 826 649 B1 | 7/2001 |

OTHER PUBLICATIONS

Singaporean Search Report and Written Opinion dated Aug. 19, 2013 in Patent Application No. 201105327-9.
Written Opinion and Search Report dated Oct. 4, 2012 in Singapore Patent Application No. 201105327-9 filed Jul. 20, 2011.

* cited by examiner

*Primary Examiner* — Andargie M Aychillhum
(74) *Attorney, Agent, or Firm* — Chip Law Group

(57) ABSTRACT

A waveguide, printed circuit board and a method of fabricating a waveguide that includes: providing a ceramic powder and polymer binder slurry, and forming the waveguide from the slurry. The waveguide and a printed circuit that includes the waveguide are also described.

3 Claims, 3 Drawing Sheets

PCB
Assembly

WAVEGUIDE AND METHOD FOR MAKING A WAVEGUIDE

FIELD OF THE INVENTION

The present invention relates to a waveguide, printed circuit board, and method.

BACKGROUND

Research on thin interconnect structures has been directed to reducing cost and reducing complexity in manufacturing, to attempt compete with printed circuitry. Development of thin interconnect structures for high data transfer is particularly tough due to problems with high frequency signals. Stability of Electro-Magnetic (EM) propagation, as well as consistent signal strength may be desirable for establishing effective data communication inside electronics devices.

SUMMARY

Here, a composite material is proposed to enable the production of waveguides having good EM wave confinement with low dissipation loss.

The invention relates to an architecture and method for directing travelling Electro-Magnetic (EM) waves by means of connecting a thin stripe between electronic integrated circuit (IC) chips on, particularly printed-circuit assembly. This invention aims to achieve high dielectric constant and low dielectric loss that are essential for high frequency interconnectivity.

In this method, a polymer-ceramic composite having controllable dielectric constant and low loss tangent is proposed. This material comprises fine powder of metal oxide, mixed with dispersion solution of PolyTetraFuoro-Ethylene particles suspended in water. By thorough mixing, a slurry mixture can be generated at room condition.

Particularly, a formation of thin dielectric sheet is proposed using coating method to dispense viscous paste containing organic binder and ceramic powder. Its dielectric characteristics are adjusted by the mixing ratio of ceramic content to attain high dielectric constant. This composite can be easily pressed or rolled to give uniform and consistent thin layer which may be sliced into desired patterns.

Such architecture of thin layer allows conformal surface contact on flat Printed Circuit Board (PCB). In this regard, the EM waves can be fed into thin layers and propagate between IC components at different locations with minimum EM radiation and absorption in electronics devices.

The present invention aims to provide a method for focusing and confinement of EM communication signal in thin waveguides by tuning their dielectric behaviours at high frequency range.

In general terms, the invention proposes a uniformly developed thin sheet that can be cut or machined into specific patterns for attaching on PCB to improve the interconnectivity between IC components.

A second aspect, the invention provides a method to enable a low cost processing method for making narrow stripes with multiple bends which fit between IC components, without modifying the production of PCB.

BRIEF DESCRIPTION OF THE DRAWINGS

One or more example embodiments of the invention will now be described, with reference to the following figures, in which.

DETAILED DESCRIPTION

In a high data transfer rate system, the material for interconnects plays an important role in achieving stable and robust Electro-Magnetic (EM) propagation. When the electronics assembly becomes smaller and more compact, the design of thin and narrow interconnects between integrated circuit (IC) components may become more difficult for high data volume.

Polymers are usually low in dielectric constant. A low dielectric constant may not desirable in waveguides as it makes the focusing and confinement of EM wave propagation less effective. However in liquid form, polymers may offer easier and cheaper production using coating and printing processes.

Ceramic particles may be processed in a complex heat sintering process to form a high dielectric constant medium. However, the process may be expensive.

In one embodiment, liquid polymer is used as a binder for ceramic particles. The fine ceramic particles are glued to form a thin sheet by curing the polymer, which avoids a complex heat sintering processes.

The liquid polymer-ceramic may comprises Metal Oxide powder 101, for example, Strontium Titanate (SrTiO3), or Titanium Dioxide (TiO2), is stirred into liquid polymer 102, for example, Poly-Tetra-Fluoro-Ethylene (PTFE), Poly-Styrene (PS) or Poly-Propylene (PP). The composite 103 is a viscous slurry with smooth texture, similar to paint, and carrying uniformly dispersed particles, which can be dispensed or coated to a desired mould.

The electrical behaviours of the mentioned ingredients are as follows:

| Chemical | Dielectric Constant | Loss Tangent |
|---|---|---|
| Strontium Titanate | 300 | 0.0050 |
| Titanium Dioxide | 100 | 0.0050 |
| Poly-Tetra-Fluoro-Ethylene | 2.5 | 0.0002 |

* Published at 1~10 GHz

Figure 1:
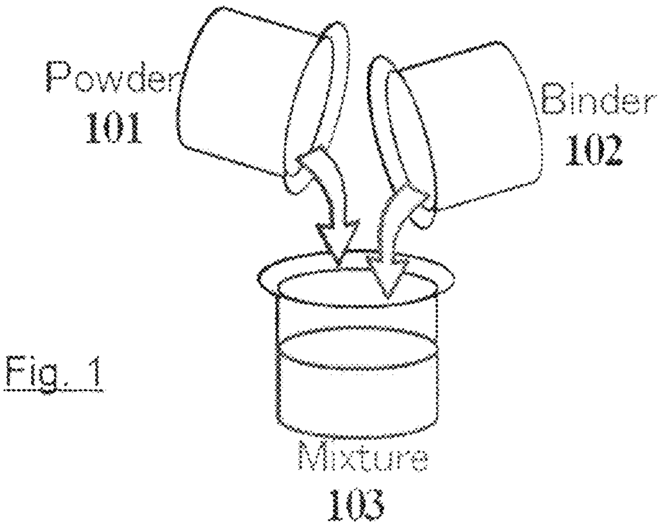
FIG. 1 shows the proposed mixing of ceramic powder and polymeric binder.
Figure 2:
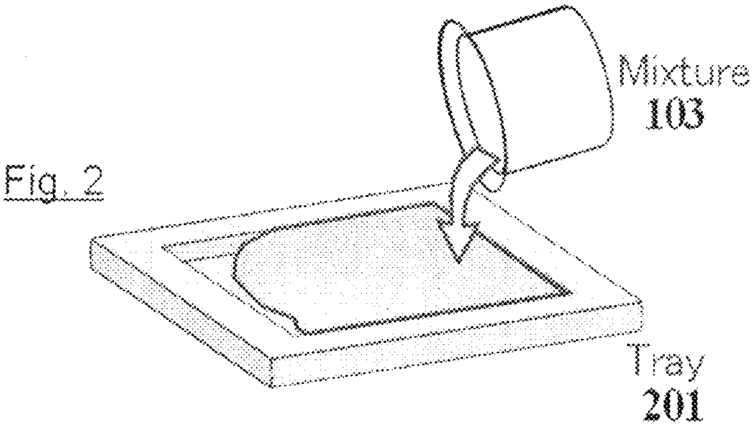
FIG. 2 shows the proposed dispensing of composite slurry to form thin sheet.

Next, as illustrated in FIG. 2, the mixture is dispensed onto a flat tray 201 with a containing depth of about 0.5 mm~1.0 mm. The depth of the tray determines the thickness of the dielectric sheet. Likewise, the surface area of the desired sheet may be adjusted by the size of tray 201. Any excess from pouring the mixture 103 will overflow outside of the tray 201.

Then dispensed liquid mixture 103 in the tray 201 is transferred into a low-pressure chamber for degassing. For degassing purpose, the painted composite layer may be placed in a low pressure desiccator at the range 50~80 kPa, for at least 5 hours. This helps to remove the air bubbles in the dispensed layer generated from the mixing process.

Figure 3:
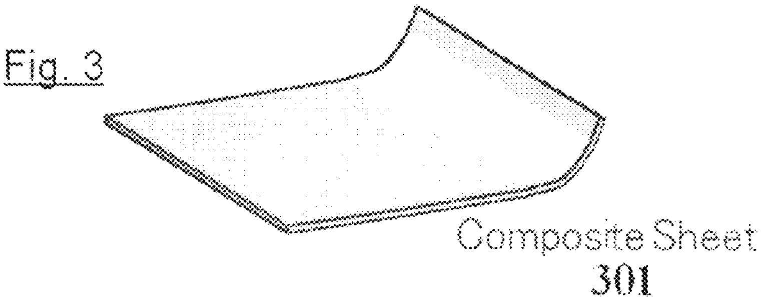
FIG. 3 shows the schematic of composite sheet after polymerization.

Thermal curing of the liquid mixture 103 is used to dry and polymerize the organic content in the binder. This is carried out at about 300-350° C. for about 1 hour. Subsequently, the dried layer can be lifted off from the tray 201 as soon as it is cooled. As in FIG. 3, this sheet 301 made of the composite material should inherited to some extent, the high dielectric constant of ceramic with low loss tangent.

Figure 4:
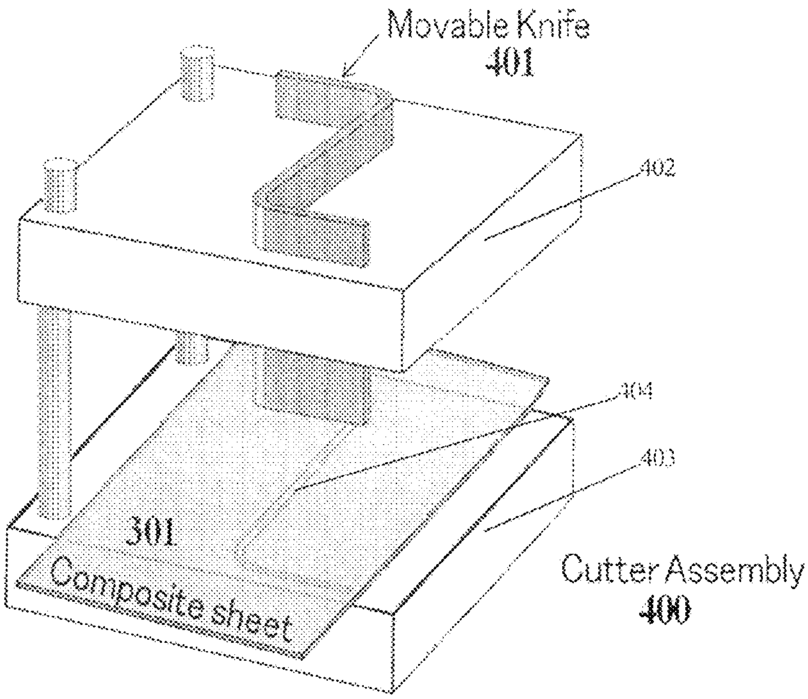
FIG. 4 shows the proposed cutter assembly for composite sheet.
Figure 5:
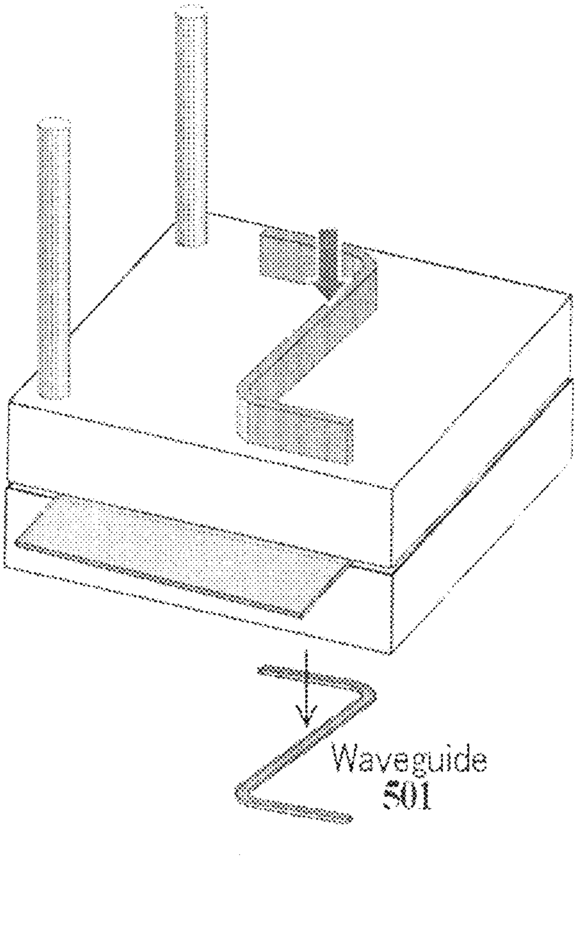
FIG. 5 shows the proposed cutting process of waveguide.

Depending on the desired interconnect shape, a mechanical cutting assembly 400 can be customised. As shown in FIG. 4, in the case which 'Z'-shape is desired, the tailored cutting knife 401, together with steel slotted dies 402,403 are designed, according to the dimensions and shape of the desired waveguide. The composite sheet 301 is clamped between two steel blocks 402,403, positioned where the through patterned slots 404 in each block 403 were aligned. Following that, as in FIG. 5, the cutter knife 401 is pressed down through the slots 404 in the two steel blocks 402,403 sandwiching the composite sheet 301, and a waveguide interconnect 501 is ejected from the slot 404 at the base of the cutter assembly 400.

Figure 6:
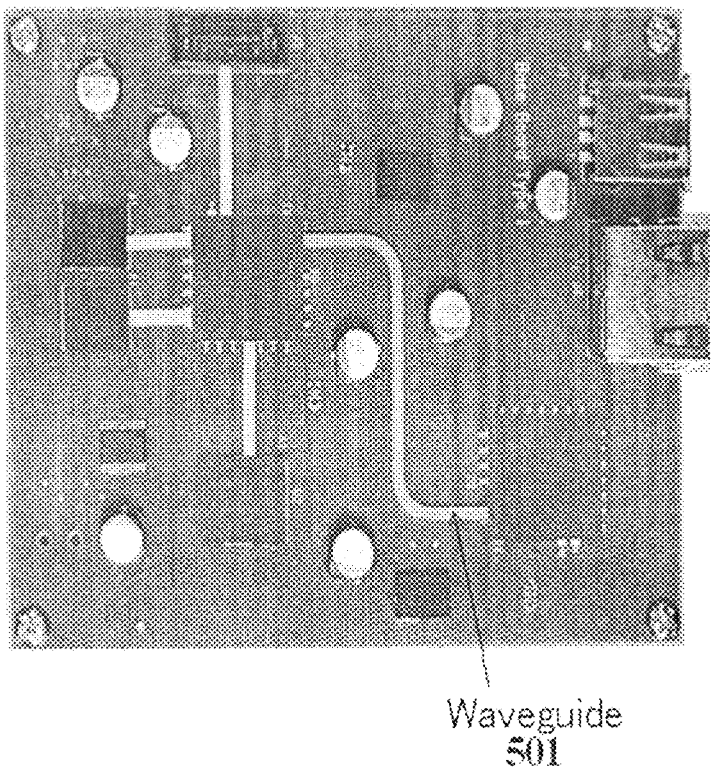
FIG. 6 shows the schematic of interconnect on PCB using waveguides.

The waveguide interconnect 501 can be glued on PCB, as shown in FIG. 6, with both ends placed in contact with the IC chips or any other electronics components. The material properties of the composite should help to focus and retain the EM wave during the data transmission operations. The waveguide can be placed touching the IC chips, without any additional interface. Ideally, there should be minimum gap between the ends of waveguide and IC components.

While example embodiments of the invention have been described in detail, many variations are possible within the scope of the invention as will be clear to a skilled reader.

The invention claimed is:

1. An interconnect waveguide, comprising: a ceramic powder and a polymer binder composite, wherein a dielectric loss tangent of the polymer binder composite is below 0.005, wherein the ceramic powder is at least one of Strontium Titanate or Titanium Dioxide and the polymer binder is at least one of Poly-Tetra-Fluoro-Ethylene, Poly-Styrene or Poly-Propylene.

2. The waveguide of claim 1, wherein the dielectric loss tangent of the polymer binder composite is below 0.001.

3. A printed circuit board, comprising: a plurality of integrated circuit (IC) components connected by at least one waveguide for transmission of electromagnetic waves, wherein said at least one waveguide comprising comprises a ceramic powder and a polymer binder composite, and wherein a dielectric loss tangent of the polymer binder composite is below 0.005, wherein the ceramic powder is at least one of Strontium Titanate or Titanium Dioxide and the polymer binder is at least one of Poly-Tetra-Fluoro-Ethylene, Poly-Styrene or Poly-Propylene.

* * * * *